US012588145B2

(12) United States Patent
Smithells et al.

(10) Patent No.: US 12,588,145 B2
(45) Date of Patent: Mar. 24, 2026

(54) METHOD FOR FORMING FLIPPED-CONDUCTOR-PATCH

(71) Applicant: Microchip Technology Caldicot Limited, Caldicot (GB)

(72) Inventors: John Adam Tracy deMercleden Smithells, Caldicot (GB); Nina Biddle, Coleford (GB)

(73) Assignee: Microchip Technology Caldicot Limited, Caldicot (GB)

( * ) Notice: Subject to any disclaimer, the term of this patent is extended or adjusted under 35 U.S.C. 154(b) by 832 days.

(21) Appl. No.: 17/868,100

(22) Filed: Jul. 19, 2022

(65) Prior Publication Data

US 2022/0361329 A1     Nov. 10, 2022

Related U.S. Application Data

(62) Division of application No. 16/186,872, filed on Nov. 12, 2018, now Pat. No. 11,432,402.

(Continued)

(51) Int. Cl.
*H05K 3/00* (2006.01)
*H05K 1/02* (2006.01)
(Continued)

(52) U.S. Cl.
CPC ........... *H05K 1/112* (2013.01); *H05K 1/0298* (2013.01); *H05K 1/144* (2013.01); *H05K 3/007* (2013.01);
(Continued)

(58) Field of Classification Search
CPC ...... H05K 1/112; H05K 1/0298; H05K 1/144; H05K 1/111; H05K 3/007; H05K 3/243;
(Continued)

(56) References Cited

U.S. PATENT DOCUMENTS 5,865,934 A     2/1999  Yamamoto et al.
9,005,995 B2 *  4/2015  Gracias ................ A61K 9/5192
                                                                    436/95

(Continued)

FOREIGN PATENT DOCUMENTS

CN       101257775 A  *  9/2008  ......... H01L 21/4857
EP        1608210 A1 *  12/2005  ............... H05K 3/28
(Continued)

OTHER PUBLICATIONS

Translation of CN-101257775-A (Year: 2008).*
(Continued)

*Primary Examiner* — Jeffrey T Carley
(74) *Attorney, Agent, or Firm* — Glass & Associates; Kenneth Glass; Ken D'Alessandro

(57) ABSTRACT

A method includes providing a layer of non-conductive material having a conductive electroplating seed layer formed on a surface thereof; applying a photoresist layer over the surface of the conductive electroplating seed layer; and defining wiring channels in the photoresist resist layer. The method includes electroplating a conductive material in the defined wiring channels; adhering a non-conductive layer over the photoresist layer and the plated conductive material in the wiring channels; and removing the layer of non-conductive material and the conductive electroplating seed layer.

19 Claims, 9 Drawing Sheets

Related U.S. Application Data

(60) Provisional application No. 62/744,515, filed on Oct. 11, 2018.

(51) Int. Cl.

| | |
|---|---|
| *H05K 1/11* | (2006.01) |
| *H05K 1/14* | (2006.01) |
| *H05K 3/24* | (2006.01) |
| *H05K 1/03* | (2006.01) |
| *H05K 1/181* | (2026.01) |

(52) U.S. Cl.
CPC ........... *H05K 3/243* (2013.01); *H05K 1/0366* (2013.01); *H05K 1/0393* (2013.01); *H05K 1/111* (2013.01); *H05K 1/119* (2013.01); *H05K 1/181* (2013.01)

(58) Field of Classification Search
CPC .... H05K 3/4694; H05K 3/108; H05K 3/3485; H05K 3/4658; H05K 2203/0156
See application file for complete search history.

(56) References Cited

U.S. PATENT DOCUMENTS

| | | | |
|---|---|---|---|
| 9,066,439 B2 | 6/2015 | Segawa et al. | |
| 9,449,913 B2 * | 9/2016 | Lee ..................... | H01L 23/5226 |
| 11,260,221 B2 * | 3/2022 | Pepin ................... | A61N 1/0553 |
| 2001/0010303 A1 | 8/2001 | Caron et al. | |
| 2005/0179129 A1 | 8/2005 | Sasaki | |
| 2006/0007641 A1 | 1/2006 | Muenzberg | |
| 2006/0272854 A1 * | 12/2006 | Yamano ................. | H05K 1/186 174/262 |

| | | | |
|---|---|---|---|
| 2007/0289127 A1 * | 12/2007 | Hurwitz .............. | H01L 21/4857 257/E23.005 |
| 2009/0084595 A1 | 4/2009 | Park et al. | |
| 2012/0030938 A1 | 2/2012 | Park et al. | |
| 2013/0200528 A1 * | 8/2013 | Lin .......................... | H01L 24/97 257/774 |
| 2013/0280519 A1 * | 10/2013 | Hsiao ................... | H05K 1/0373 428/325 |
| 2014/0110159 A1 * | 4/2014 | Wei ...................... | H05K 1/0265 174/250 |
| 2014/0174804 A1 * | 6/2014 | Tseng ..................... | H05K 3/423 29/832 |
| 2014/0326607 A1 * | 11/2014 | Cohen ...................... | C25D 5/02 205/136 |
| 2015/0076683 A1 | 3/2015 | Lim et al. | |
| 2015/0126030 A1 * | 5/2015 | Yang ................. | H01L 21/76877 438/675 |
| 2016/0172287 A1 * | 6/2016 | Arisaka ............. | H01L 23/49822 257/774 |
| 2019/0059154 A1 | 2/2019 | Liu et al. | |

FOREIGN PATENT DOCUMENTS

| | | | | |
|---|---|---|---|---|
| JP | 2004056043 A | * | 2/2004 | .............. C25D 5/10 |
| WO | WO-0059645 A1 | * | 10/2000 | ........... H05K 3/4647 |

OTHER PUBLICATIONS

Translation of JP-2004056043-A (Year: 2004).*

PCT/EP2019/070889, International Search Report and Written Opinion, International Search Authority, Nov. 20, 2019.

* cited by examiner

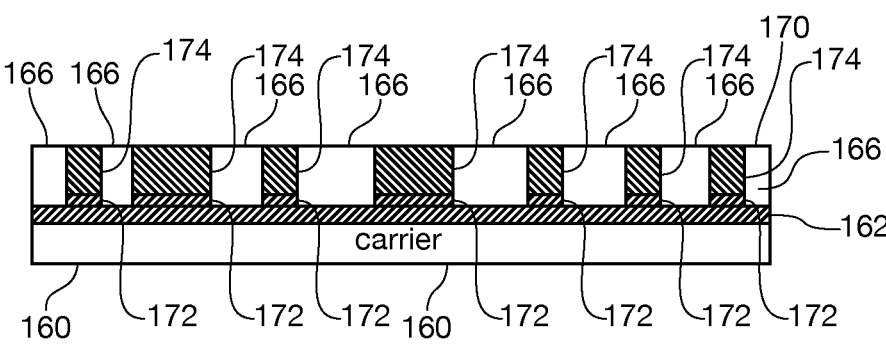
FIG. 4D
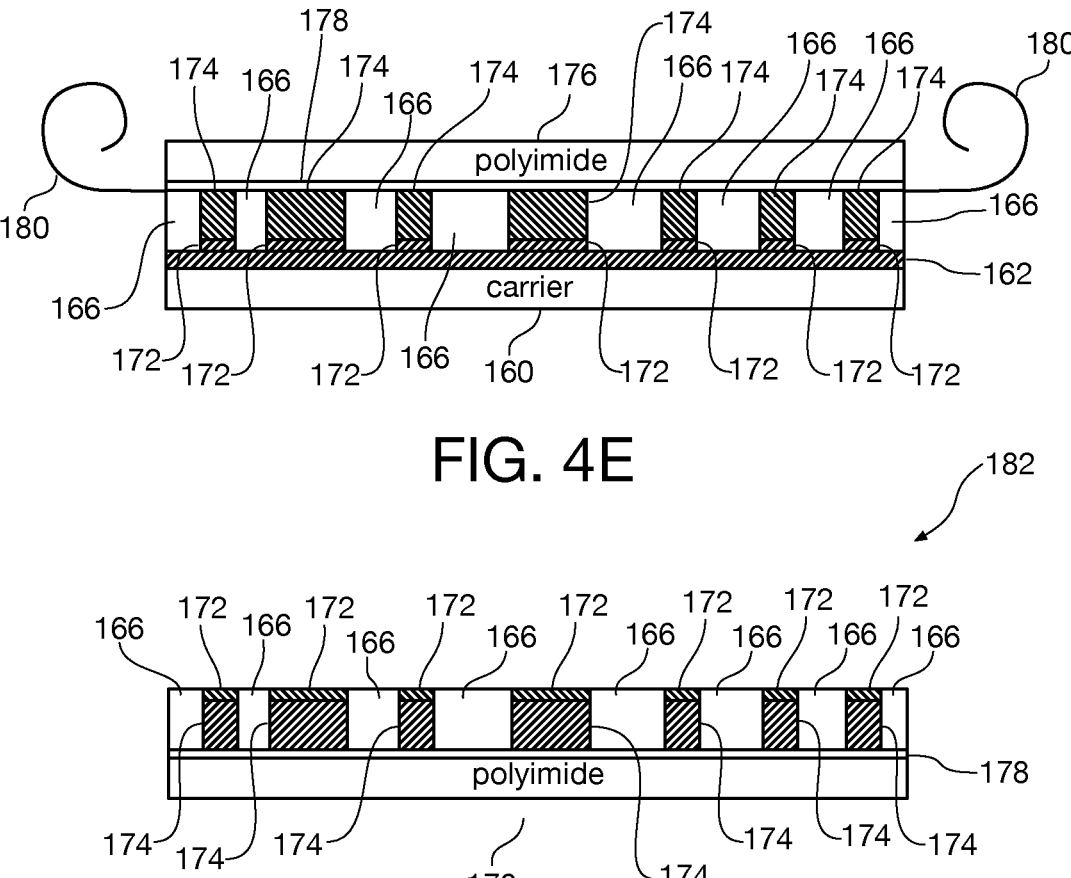
FIG. 4E
FIG. 4F

METHOD FOR FORMING FLIPPED-CONDUCTOR-PATCH

REFERENCE TO RELATED APPLICATIONS

The present application is a divisional of U.S. Non-Provisional patent application Ser. No. 16/186,872, filed on Nov. 12, 2018, that claims priority to U.S. Provisional Patent Application Ser. No. 62/744,515, filed on Oct. 11, 2018, the contents of each of which are incorporated by reference in their entirety.

BACKGROUND

The present invention relates to circuit assembly substrates. More particularly, the present invention relates to laminated structures that provide very fine conductive tracks layers for use on printed circuit board substrates.

Due to the shrinking of die (but often with increased pin-count) there is a need is to develop packaging—interconnect technology to interface with these die as they evolve but that itself meets the demand for size decrease. Wire-bonding die pad connections to a carrier substrate has been an excellent interface method but recently chip scale packages (CSP die or 'flip-chips') are more frequently connected directly to the substrate transferring the 'fanning out' issue of tracks to the printed circuit board (PCB) substrate.

Etched fine line track/gaps on PCBs have become problematic mainly because as the width of the conductive tracks becomes smaller, etching reaches its process limits and the adhesion of the copper tracks and connection pads to the substrate becomes greatly reduced.

Some PCB and die packaging businesses have developed methods of having very fine tracking layers on the outside of their substrates. PCB and IC companies such as Kyocera, Toshiba and Cicor have developed processes to add ultra-fine-line capability to integrate their IC and PCB laminated structures and offerings. These methods are often costly and do not provide the flexibility that is required for some designs that incorporate different elements of a design such as die, SMT components and PCB that are normally purchased separately and not necessarily from the same source.

As the die begin to be integrated into the substrate itself then the process is no longer straightforward as the substrate design, fabrication and assembly become integrated (and usually proprietary) activities needing an approach different from just providing a PCB and assembling components onto it. These activities generally involve proprietary additive processes rather than subtractive-etching ones, but are still subject to limitations as to where and how these processes can be introduced into the design, usually at the outer layers.

One problem is to be able to provide the ability to include ultra-fine tracking layers into PCB laminations where such tracking is not part of normal PCB builds. Another problem is the difficulty of providing small vias in laminated PCB structures. Yet another problem is minimizing the lateral area needed to make connections between lower and upper layers of laminated PCB assemblies. A further problem is that layers laminated onto PCB substrates experience non-linear and uncontrolled stretching, making layer registration difficult.

BRIEF DESCRIPTION

According to one aspect of the present invention, a method includes providing a layer of non-conductive material having a conductive electroplating seed layer formed on a surface thereof; applying a photoresist layer over the surface of the conductive electroplating seed layer; and defining wiring channels in the photoresist layer. The method includes electroplating a conductive material in the defined wiring channels; adhering a non-conductive layer over the photoresist layer and the electroplated conductive material in the wiring channels; and removing the layer of non-conductive material and the conductive electroplating seed layer.

According to one aspect of the present invention, a method includes providing a layer of non-conductive material having a conductive electroplating seed layer formed on a surface thereof; applying a photoresist layer over the surface of the conductive electroplating seed layer; and defining wiring channels in the photoresist layer. The method includes electroplating a first layer of a first conductive material in the defined wiring channels; electroplating a second layer of a second conductive material over the first layer in the defined wiring channels; adhering a non-conductive layer over the photoresist layer and the electroplated second conductive material in the defined wiring channels; and removing the layer of non-conductive material and the conductive electroplating seed layer.

BRIEF DESCRIPTION OF THE DRAWING FIGURES

The invention will be explained in more detail in the following with reference to embodiments and to the drawing in which are shown:

FIG. 1A through. FIG. 1I are cross-sectional diagrams showing the formation of a patch circuit assembly structure in accordance with illustrative embodiments of the present invention;

FIGS. 4A through 4G are cross-sectional diagrams showing the formation of a patch in accordance with other illustrative embodiments of the present invention.

DETAILED DESCRIPTION

Persons of ordinary skill in the art will realize that the following description is illustrative only and not in any way limiting. Other embodiments will readily suggest themselves to such skilled persons.

Figures 1A, 1B, 1C, 1D, 1E:
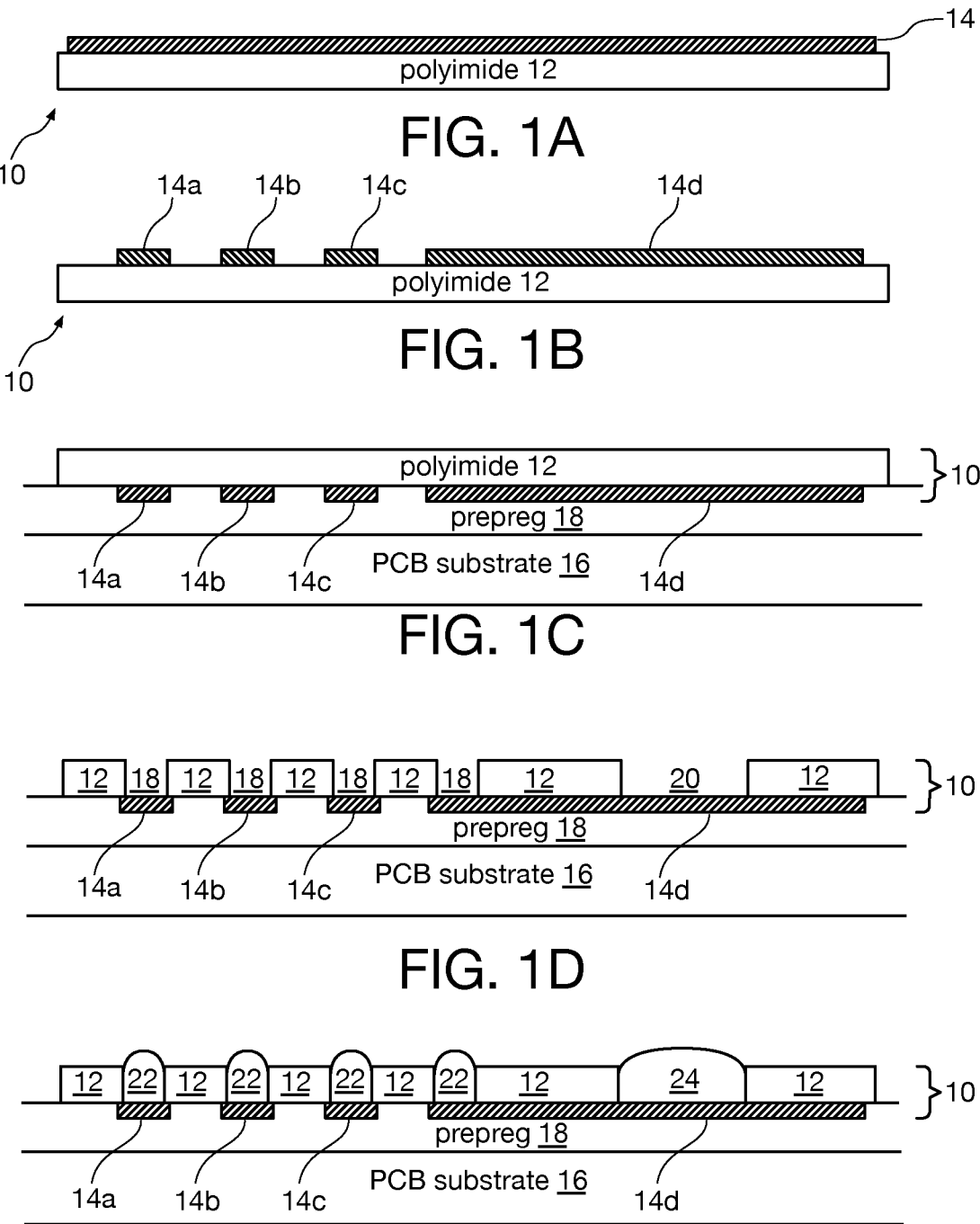

Referring first to FIG. 1A, a cross sectional view shows a substrate "patch" 10 that may be used to provide very fine conductive track layers for use on printed circuit board substrates. According to an aspect of the invention the patch may be formed from a flexible material. A non-conductive substrate 12 formed from a layer of material that can withstand the temperatures encountered during PCB lamination processes, such as a polyimide layer, is shown with a conductive layer 14 formed by known processes such as deposition or etching, over a wiring face of the non-conductive substrate 12. In one aspect of the present invention, the conductive layer 14 is a layer of copper. In accordance with an aspect of the invention, the non-conductive substrate 12 is "thin" In accordance with the present invention, a "thin", non-conductive substrate 12, has a thickness of less than about 100μ, and preferably between about 10μ, to about 50μ. In accordance with an aspect of the invention, conventional photolithography and etching techniques are used to etch away portions of the conductive layer 14 to form a pattern of conductive wiring traces including illustrative traces 14a, 14b, 14c, and 14d as shown in the cross-sectional diagram of FIG. 1B. According to one aspect of the present invention, at least some of the wiring traces having widths no wider than 50μ.

The non-conductive substrate 12 having the defined conductive traces 14a, 14b, 14c, and 14d is oriented with its conductive traces 14a, 14b, 14c, and 14d facing downward and placed on a surface of a PCB substrate 16 over which a prepreg layer 18 has been formed. A prepreg layer (short for "pre-impregnated") is a substrate fabric such as fiberglass that has been impregnated with resin (an example of which is NEMA grade designation FR4). The resin is pre-dried, but is not hardened, so that when it is heated under pressure during the laminating process, it flows, sticks to, and covers the conductive traces 14a, 14b, 14c, and 14d and fills all interstices between the conductive traces 14a, 14b, 14c, and 14d.

As previously noted, etched fine line track/gaps on prior-art PCBs become problematic mainly because the copper track/pad adhesion to the substrate becomes greatly reduced as the line widths of the tracks becomes smaller and etching reaches its process limits A typical conductive trace used in the present invention may be about 24μ wide and about 12μ high. It is contemplated that the present invention can be implemented using conductive traces having widths as small as about 1μ and thicknesses of about 1μ. During the laminating process, the prepreg layer 18 forms around and provides dimensional stability for the conductive traces 14a, 14b, 14c, and 14d, filling in all of the interstices between them.

FIG. 1C is a cross-sectional diagram of the laminated structure that shows the structure resulting after the patch 10 including the non-conductive substrate 12 having the conductive traces 14a, 14b, 14c, and 14d has been laminated to the PCB substrate 16 and prepreg layer 18 by pressing and heating to laminate the prepreg layer 18 as is known in the art. FIG. 1C shows that the conductive traces 14a, 14b, 14c, and 14d have become securely embedded in the prepreg layer 18 of the hybrid laminated substrate that includes the PCB substrate 16 and the patch 10 including non-conductive substrate 12 and conductive traces 14a, 14b, 14c, and 14d.

Figure 5:
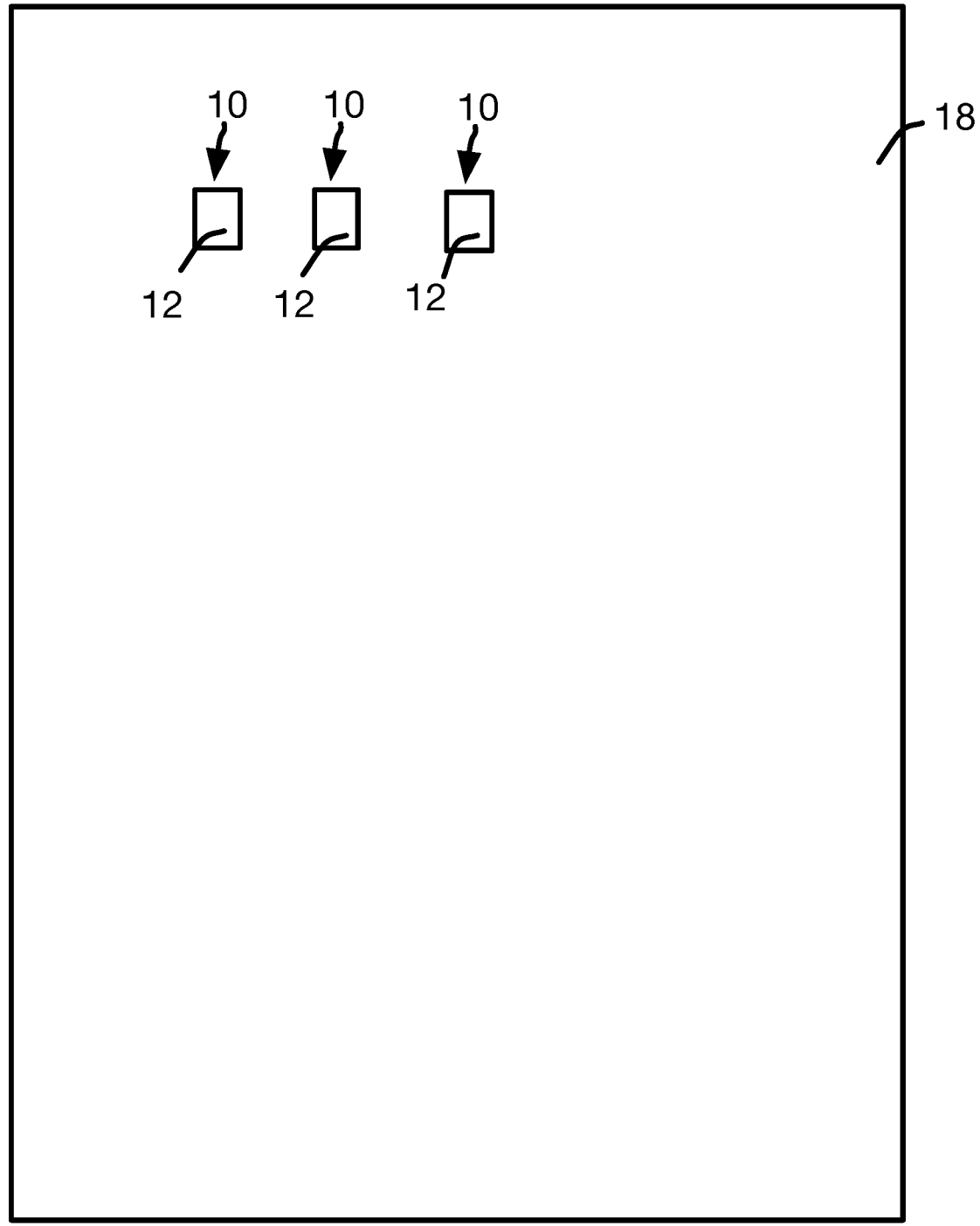
FIG. 5 shows a top view of the structure of FIG. 1C in accordance with an embodiment of the present invention.

FIG. 5 shows a top view of the structure of FIG. 1C that illustrates examples of patches 10 that include flexible non-conductive substrate 12 and that extend over prepreg layer 18.

Referring now to FIG. 1D, which illustrates a cross-sectional diagram of the laminated structure after small holes 18 (e.g., down to about 20μ or less in diameter) have been formed in the non-conductive substrate 12. This can be done using, for example, laser ablating. Larger holes (e.g., hole 20) for surface mount technology (SMT) components (e.g., components of 0201 size and above), for which formation by laser ablation would be more time consuming, can be formed in the non-conductive substrate 12, for example, as laser cut-through openings through which a Sn/Cu paste can be printed and later sintered in accordance with normal surface mount technology (SMT) solder attach assembly processes. FIG. 1D shows the laminated structure after holes 18 and 20 have been formed in the non-conductive substrate 12 to expose the copper conductive traces 14a, 14b, 14c, and 14d.

Figures 1F, 1G:
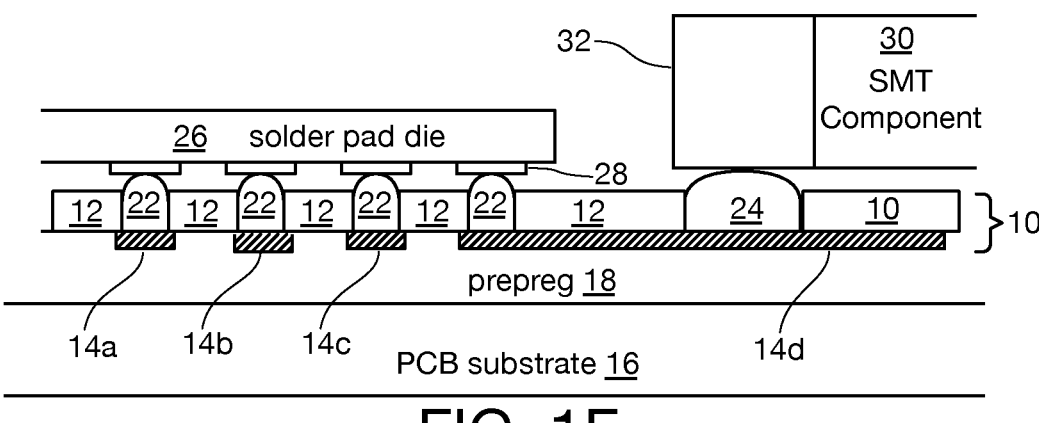

Referring now to FIG. 1E, which illustrates a cross-sectional diagram of the laminated structure, after solder bumps 22 are formed in small holes 18 and a larger solder bump 24 is formed in larger hole 20. Solder bumps 22 are used for connecting to chip scale package (CSP) die pads and also for small SMT components such as 01005 (appx. 10 mil by 5 mil), 0201 (appx. 20 mil by 10 mil) or 008004 (appx. 8 mil by 4 mil) sized resistors or capacitors. FIG. 1F is a cross-sectional diagram of the laminated structure that shows a solder pad integrated circuit die 26 bonded to solder bumps 22 that have been previously formed in holes 18 and an SMT component 30, one lead 32 of which is shown bonded to the larger solder bump 24 that has previously been formed in hole 20. According to one aspect of the present invention, the holes 18 may be filled with a conductive ink. The placement and connection of the solder pad integrated circuit die 26 and the SMT component 30 on the laminated structure using existing pick-and-place equipment using fiducials is known in the art.

Prior-art laminating processes for production PCBs use sheets or panels of FR4 or similar material that are typically 24"×18" (approximately 600 mm×450 mm) Registration of a pre-etched layer for lamination onto an existing pre-etched panel at this scale is extremely difficult, and the fact that the materials involved will stretch differently, especially if they not of same type, compounds the registration problem. Even if the two-pre-etched layers can be aligned within a target tolerance, any difference in coefficient of thermal expansion of the materials will cause enormous problems across a 600×450 mm panel. Mechanical registration of different layers using drilled tooling holes at these opposing scales is simply not an option. This has led to the PCB fabrication practice where a PCB fabricator will build onto an existing core, etching a new layer after registering it to the existing underlying pattern using computerized adjustments for, inter-alia, stretch.

In contrast to the prior-art, the present invention contemplates employing a relatively small patch 10. The patch circuit areas are relatively small and can be placed in a step-and-repeat pattern across the FR4 panels. A non-limiting example of such a patch in accordance with the present invention is a 9 mm×9 mm patch "component" formed on a 50μ thick flex polyimide substrate employing 50μ wide tracks formed from ¼-ounce copper (having a thickness of about 9μ). It is presently contemplated that 15μ tracks having thicknesses of about 7.5μ are possible using the etching concepts of the present invention. Such a small patch component can be very accurately machine placed locally on a PCB by existing pick-and-place equipment using fiducials as is known in the art. In general, the area of the patch in accordance with the present invention is no larger than between about 500 mm² and about 1,000 mm². As the area of the patch increases above this value, registration and stretching problems start to become untenable, resulting in yield in assembly problems.

Layer-to-layer vias are also important in printed circuit board assemblies and efforts are made to form them as small as possible given the thicknesses of the layers in they are formed. The techniques of the present invention include another way to form layer-to-layer vias using via-fill material (Sn/Cu paste that sinters in lamination). Because the patch can be accurately placed with SMT equipment, small pads for vias on different layers and for printed solder bumps can be accurately paired. This aspect of the invention is illustrated with reference to FIGS. 1G and 1H.

FIG. 1G is a cross-sectional view of an illustrative laminated PCB assembly in accordance with another aspect of the present invention. The illustrative laminated PCB assembly depicted in FIG. 1G shows pad 28 of the solder pad integrated circuit die 26 connected to the conductive trace 36 on the second wiring face of the PCB substrate 16 through a solder bump 22, the conductive trace 14d of the patch 10, via 40 formed in the prepreg layer 18, the conductive trace 38 on the first wiring face of the PCB substrate 16 and the via 34 formed through the PCB substrate 16. Persons of ordinary skill in the art will appreciate that the particular circuit connections shown in FIG. 1G are completely arbitrary and are simply shown to illustrate how multi-layer vias can be incorporated into a laminated printed circuit board assembly in accordance with the present invention.

Figures 1H, 1I:
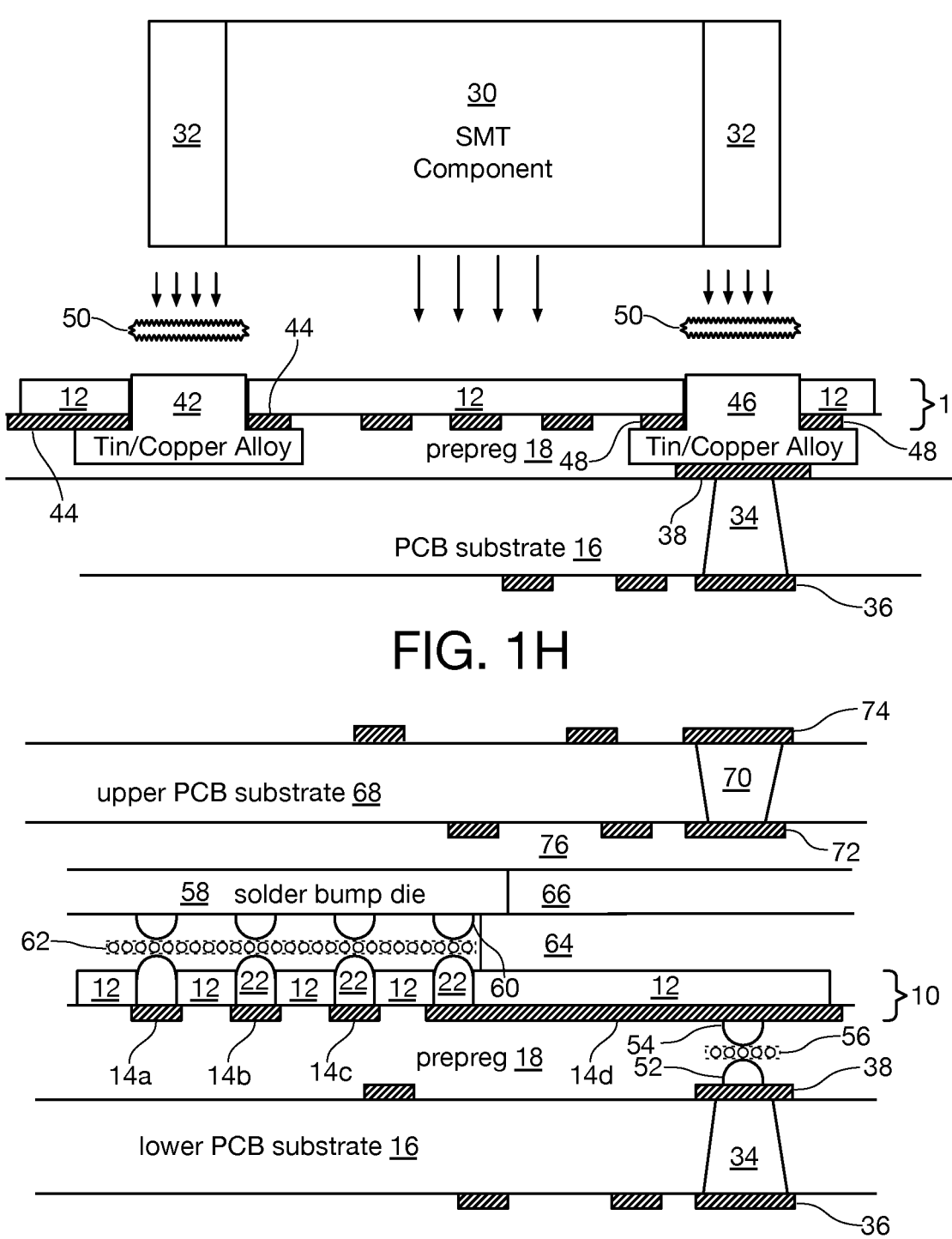

FIG. 1H is a cross-sectional view of an illustrative laminated PCB assembly in accordance with another aspect of the present invention. A PCB substrate 16 is shown having a via 34 formed between conductive trace 36 on a second wiring face of the PCB substrate 16 and conductive trace 38 on a first wiring face of the PCB substrate 16. A prepreg layer 18 is formed over the first wiring face of the PCB substrate 16 and a patch 10 including a non-conductive substrate 12 having conductive wiring traces on a face thereof is laminated face down into the prepreg layer 18 as previously described. Via openings are laser-cut through the non-conductive substrate 12 of patch 10 into the prepreg layer 18. The prepreg layer 18 acts as an insulation layer and vias through to conductive traces on the patch 10 and/or on the underlying PCB substrate 16 are created by printing a Sn/Cu paste into pre-lasered prepreg openings. A via 42 connected to a wiring trace 44 on the patch 10 gets sintered in the lamination process. The via 42 is formed by via-fill prior to laminating the patch 10 onto the prepreg layer 18. The via 42 makes an electrical connection to a wiring trace 44 on the patch 10. A second sintered via 46 is shown making an electrical connection between the wiring trace 38 on the first wiring face of the PCB 16 and the wiring trace 48 on the non-conductive substrate 12 of the patch 10. Persons of ordinary skill in the art will observe that the particular connections made by vias 42 and 46 are illustrative only and merely show that connections can be made to the patch 10 or to the underlying PCB substrate 16 that can be created in the same process as that of a Sn/Cu alloy via such as via 40 illustrated in FIG. 1G.

The illustrative circuit depicted in FIG. 1H shows leads 32 of the SMT component 30 being connected to vias 42 and 46 using solder paste regions 50 during the assembly process. Persons of ordinary skill in the art will appreciate that the particular circuit connections shown in FIG. 1H are completely arbitrary and are simply shown to illustrate how multi-layer vias can be incorporated into a laminated printed circuit board assembly in accordance with the present invention.

Referring now to FIG. 1I, a cross-sectional view shows an illustrative laminated printed circuit board assembly in accordance with another aspect of the present invention. A PCB substrate 16 is shown having a via 34 formed between conductive trace 36 on a bottom face of the PCB substrate 16 and conductive trace 38 on a first wiring face of the PCB substrate 16.

In the illustrative embodiment shown in FIG. 1I, a solder bump 52 has been formed on conductive trace 38 on the first wiring face of the PCB substrate 16. A solder bump 54 has also been formed on conductive trace 14d of the patch 10. A piece of z-axis tape 56 is placed in alignment with the solder bumps 52 and 54 in a void formed in the prepreg layer 18 prior to the patch 10 being placed over the prepreg layer 18. The z-axis tape 56 will form an electrical connection between conductive trace 14d and conductive trace 38 through solder bumps 52 and 54 during the lamination process.

After the lamination process, small holes will be formed in the non-conductive substrate 12 and filled with solder bumps 22 as previously described. An integrated circuit die 58 having solder bump connections (one of which is identified at reference numeral 60) can be bonded to the solder bumps 22 using a layer 62 of z-axis tape in a void formed in prepreg layers 64 and 66. A second PCB substrate 68 can then be laminated onto the underlying structure. For illustrative purposes, the second PCB substrate 68 is shown including a via 70 formed between a conductive trace 72 on a bottom face of the PCB substrate 68 and conductive trace 74 formed on a first wiring face of the PCB substrate 68. An extra prepreg layer or layers 76 are placed over the die 58 and prepreg layers 64 and 66 to maintain the electrical and mechanical integrity of the lamination with the die 58 as a result embedded therein. As with the illustrative circuit shown as being formed by the laminated structure of FIG. 1H, persons of ordinary skill in the art will appreciate that the particular circuit connections shown in FIG. 1I are completely arbitrary and are simply shown to illustrate how multiple unique and sequential build-ups of laminated circuit substrate structures can be created to meet the needs of diverse designs, including embedding very-fine-pitched CSP die into a multi-level laminated printed circuit board assembly in accordance with the present invention.

Figure 2:
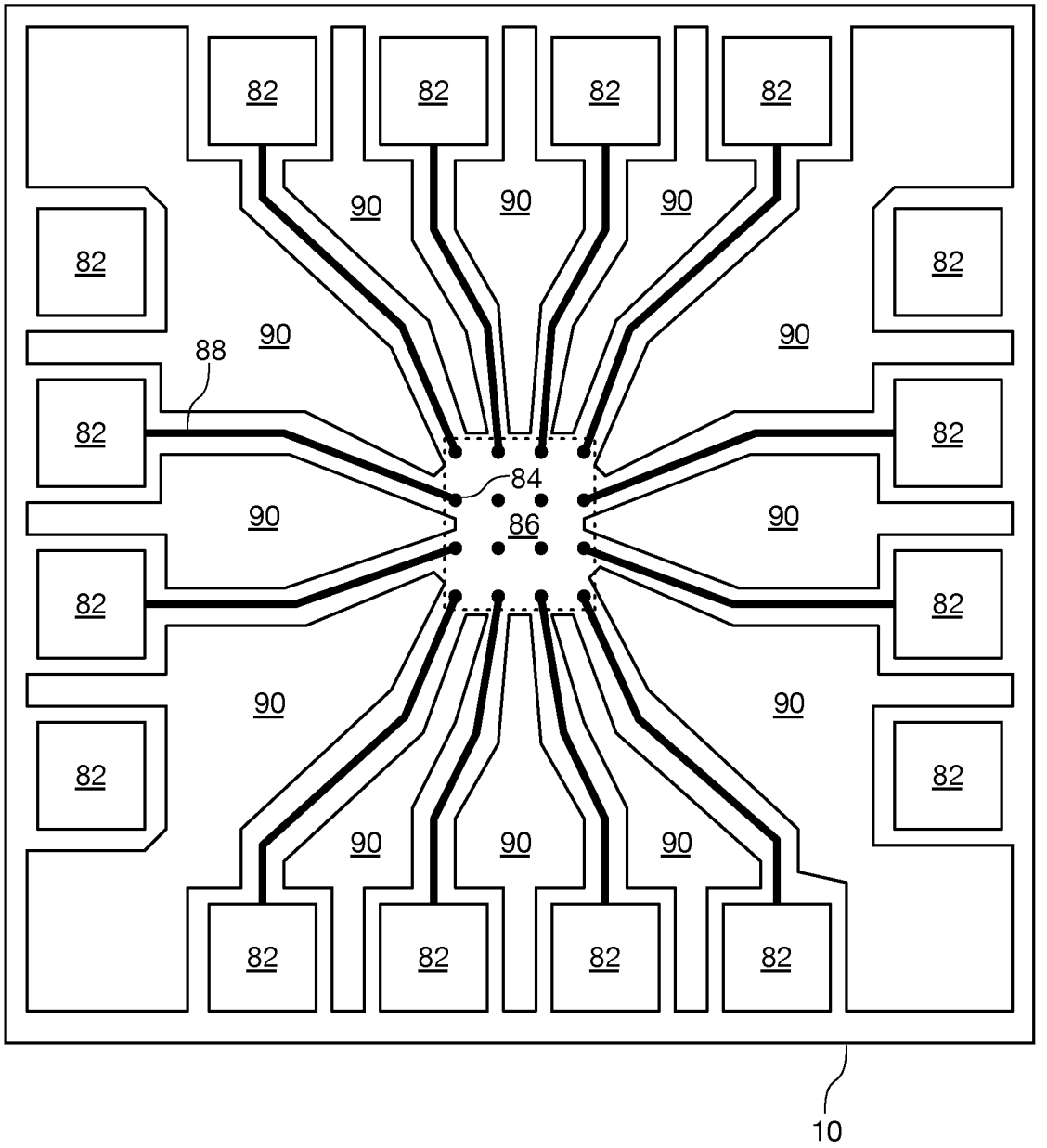
FIG. 2 is a diagram showing a top view of an illustrative patch in accordance with the present invention.

Referring now to FIG. 2, a top view of an illustrative patch 10 shows another aspect of the invention. The thin flexible material non-conductive substrate 12 on which the patch is formed will be very prone to bending so copper areas 90 are included into all gaps between conductive traces to facilitate pick and placing the patch 10 to create the flat surface needed after lamination.

The patch 10 includes a plurality of connecting pads 82. The connecting pads 82 are electrically connected to I/O pins (one of which is shown at reference numeral 84) of an integrated circuit die 86 by copper traces (one of which is shown at reference numeral 88) formed on the thin flexible material non-conductive substrate 12. Unetched solid copper regions 90 are shown left in the areas of the thin flexible material non-conductive substrate 12 in between the I/O pads 82, the area occupied by the integrated circuit die 86, and the conductive traces 88 in order to provide dimensional stability to the patch 10.

FIGS. 3A through 3D are top and cross-sectional views of an illustrative embodiment of the invention where the patch can be folded over to provide bottom-to-top connections for the laminated structure.

Figures 3A, 3B, 3C, 3D, 3E:
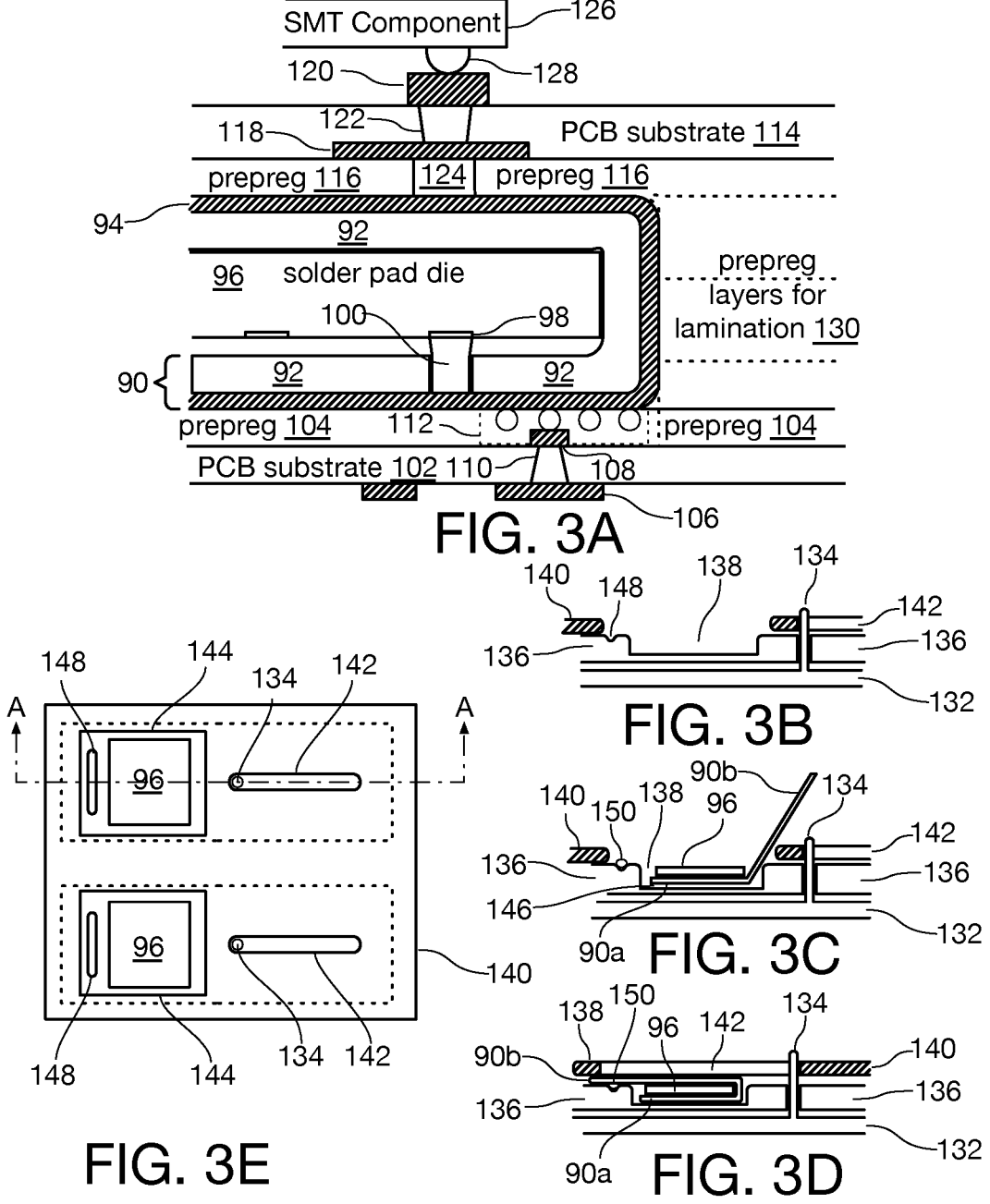
FIGS. 3A through 3E are cross-sectional and top views of an illustrative embodiment of the invention where the patch can be folded over to provide bottom-to-top connections for the laminated structure.

Referring now to FIG. 3A, a cross-sectional diagram shows a folded-over patch 90 including a flexible non-conductive substrate 92 having a conductive trace 94 formed on one of its surfaces. A solder pad integrated circuit die 96 has been bonded by one of its I/O pads 98 to a solder pad 100 communicating with the conductive trace 94. The illustrative example of FIG. 3A shows the patch 90 laminated to a PCB substrate 102 using a prepreg layer 104. A conductive trace 106 on the bottom surface of the PCB substrate 102 is electrically connected to a conductive trace 108 on the first wiring surface of the PCB substrate 102 through via 110 as noted in the previously disclosed embodiments. The wiring trace 94 on the patch 90 is shown electrically connected to the conductive trace 108 on the first wiring face of the PCB substrate 102 using a piece of z-axis tape placed in a void in the prepreg layer 104 indicated at reference numeral 112 as previously disclosed.

In the embodiment shown in FIG. 3A, the patch 90 has been folded over the solder pad integrated circuit die 96. An upper PCB substrate 114 is laminated to the top surface of the folded over patch 90 through a prepreg layer 116 and includes a conductive trace 118 on its bottom surface (a second wiring face) electrically connected to a conductive trace 120 on its top surface (a first wiring face) through a pre-formed via 122 in the PCB substrate 114. A via 124 from conductor 118 to conductive trace 94 is formed by filling a hole in the prepreg layer 116, formed by a laser, with Sn/Cu paste which sinters to form a Sn/Cu alloy in lamination as previously discussed. An SMT component 126 is shown bonded to the upper PCB substrate 114 by its solder bump I/O connections, one of which is shown at reference numeral 128. The folded-over patch 90 is shown placed in a void formed by an aperture in one or more other prepreg layers shown generally by the dashed lines to the right of the folded-over patch 90 at reference numeral 130 in order to maintain a sufficiently planar surface on which to laminate the upper PCB substrate 114.

An advantageous feature of the folded over patch of FIG. 3A is that connections to the SMT component 126 may be made from I/O pads of the solder pad integrated circuit die 96 without requiring vias that have to be laterally disposed outside of the periphery of the solder pad die 96, thus increasing the footprint of this portion of the circuit. This feature of the invention is illustrated by the connection through the conductive trace 94 of the folded-over patch. Persons of ordinary skill in the art will appreciate that FIG. 3A is a cross section of the structure and that additional conductive traces of the folded-over patch can be used to route connections to the top PCB substrate 114 from other I/O pads of the solder pad integrated circuit die 96 and/or connections from the lower PCB substrate 102 located at positions outside of the plane of the cross-section shown in FIG. 3A.

Referring now to FIGS. 3B, 3C, 3D, and 3E, a method is shown for forming the folded-over patch including portions 90a and 90b of FIG. 3A. FIGS. 3B, 3C, and 3D are cross-sectional views showing the formation of the folded-over patch 90 of FIG. 3A. The cross sections depicted in FIGS. 3B, 3C, and 3D are taken at lines A-A of FIG. 3E, which is a top view showing simultaneous formation of a plurality of folded-over patches in accordance with the present invention.

Referring now to FIG. 3B, a cross-sectional view shows a substrate ready to receive a patch (including portions 90a and 90b) that will be folded over. A fixture 132 includes registration pins, one of which is shown at reference numeral 134. The substrate on which the folded-over patch 90 is to be formed is shown a reference numeral 136. The substrate 136 includes a cavity 138 into which the patch (including portions 90a and 90b) is to be placed prior to it being folded over. At this point the patch (including portions 90a and 90b) is substantial flat.

A metal slide plate 140 is positioned over the substrate 136, which includes slots 142 that align with the registration pins 134. Apertures 144 in the slide plate 140 (shown in FIG. 3E) are positioned over the cavities 138.

Referring now to FIG. 3C, the patch (including portions 90a and 90b) is placed in the cavity 138 and held in place by a thin layer of adhesive z-axis tape (shown at reference numeral 146 in FIG. 3C) to make connections to pads on the PCB substrate 132. The portion of the patch 90 on which the integrated circuit die 96 is placed is shown at reference numeral 90a and lies flat within the cavity 138 and the portion of the patch 90 to the right of the cavity 138 shown at reference numeral 90b is forced upward at an angle by the edge of the cavity 138 and/or the edge of the aperture 144 in the sliding metal plate 140. The substrate 136 includes a groove 148 (shown in FIG. 3B, into which a bead of adhesive (shown in FIGS. 3C and 3D at reference numeral 150) is placed.

The metal slide plate 140 is then laterally moved towards the portion 90b of the patch, folding it over as shown in FIG. 3D, which depicts the position of the metal slide after it has been engaged by the end of a slot 142 to stop its lateral motion. The bead of adhesive 150, when cured, holds the distal edge of portion 90b of the patch in its folded over position, allowing further processing of the laminated structure being formed.

It is noted that more than one folded-over patch 90a and 90b may be formed simultaneously. The top view of FIG. 3E shows a pair of exemplary folded-over patches 90, but persons of ordinary skill in the art will appreciate that any number of such folded over patches 90 may be simultaneously formed depending on the configuration of the laminated circuit board assembly that is being processed.

Referring now to FIGS. 4A through 4F, cross-sectional diagrams show the formation of a patch in accordance with another illustrative embodiment of the present invention. An advantage of the embodiment depicted in FIGS. 4A through 4E is that an ultra-fine tracking of about 5μ wide can be formed using a continuous process.

Figure 4A:
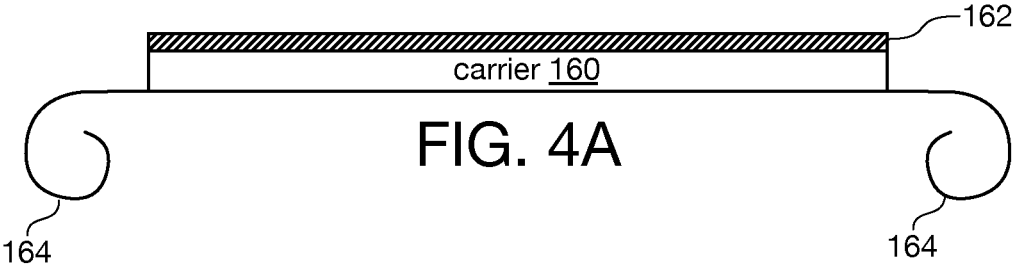

Referring now to FIG. 4A, a carrier layer 160 such as a polyester sheet having a conductive electroplating seed layer 162 such as graphite deposited on one of its surfaces is formed preferably as a roll (indicated at curled ends 164). Use of a roll is not necessary for practicing the present invention but it allows a somewhat continuous reel-to-reel process to be used in accordance with an aspect of the present invention.

Figure 4B:
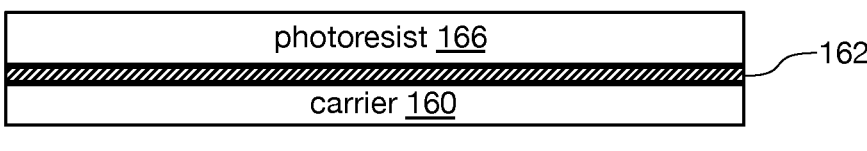

As shown in FIG. 4B, the carrier layer 160 with the conductive electroplating seed layer 162 is cut into panels. A layer of photoresist 166 is then formed and cured on the surface of the metal layer on each panel.

Figure 4C:
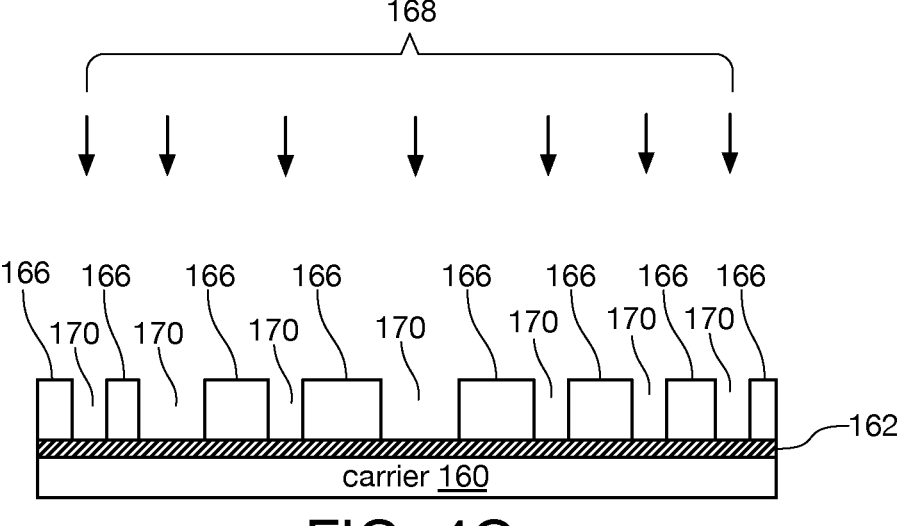

As shown in FIG. 4C, after the layer of photoresist 166 is formed and cured on the surface of the metal layer, and, it is masked, exposed (shown at arrows 168) and etched to remove the photoresist in desired regions as is well known in the photolithography art to expose portions of the underlying conductive electroplating seed layer 162 in wiring channels 170. The geometry of the wiring channels 170 defines the conductive traces that will be formed on the finished patches.

Referring now to FIG. 4D, metal is electroplated into the wiring channels 170 using the graphite conductive seed layer 162 as a cathode. FIG. 4D shows two layers of metal, a first metal layer 172 and a second layer 174. In one particular embodiment the first metal layer 172 may be a layer of Au (which may have, for example a thickness of about 0.03μ) and the second metal layer 174 may be a layer of Ni (which may have, for example a thickness of about 5μ). Persons of ordinary skill in the art will understand that, in other embodiments, different metals may be employed or that a single metal layer (e.g., Cu) may be employed. In this additive electroplating process, conductive traces having minimum dimensions of about 1μ width and 1μ thickness are also contemplated.

Referring now to FIG. 4E, a patch substrate 176, which, as previously noted may be a layer of material such as polyester or polyimide with an adhesive backing, is adhered to the top of the photoresist layer 166, and the top surfaces of the exposed second metal layers 174. The patch substrate 176 may include an adhesive backing layer 178 as a transfer adhesive and may conveniently, but not necessarily, be in the form of a roll as indicated by curled edges at reference numerals 180.

Referring now to FIG. 4F, the carrier layer 160 and its conductive electroplating seed layer 162 have been stripped away by peeling it off of the assembled layers to expose the top surfaces of the second metal layers 174 and the panels are cut into final-sized patches 182.

Figure 4G:
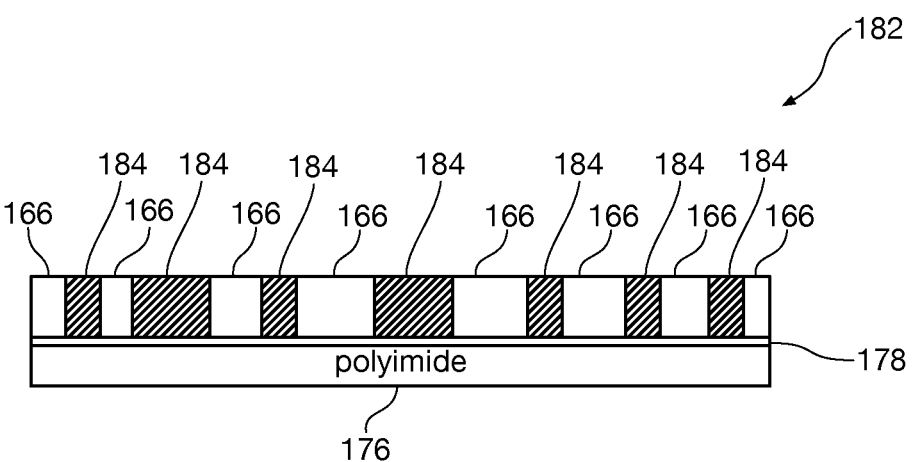

Referring now to FIG. 4G, another embodiment is shown after the carrier layer 160 and its conductive electroplating seed layer 162 have been stripped away by peeling it off of the assembled layers and the patches are cut into final-sized panels. In this embodiment, only a single plated metal layer 184 (formed from, e.g., Cu) is used. The fabrication process is the same as for the embodiments shown in FIGS. 4A through 4F, except that the two plated metal layers 172 and 174 shown in FIGS. 4D through 4F have been replaced by the single plated metal layer 184.

The various embodiments of the present invention present a small thin and flexible patch component with ultra-fine conductive tracks that can be very accurately machine placed locally using fiducials. When flipped over to laminate to a PCB substrate, the conductive tracks are embedded in a prepreg layer and central CSP pad openings can be laser ablated through the non-conductive substrate layer 12. The thin flexible material non-conductive substrate 12 is prone to bending so copper areas are included to fill gaps between conductive tracks to enable picking and placing the patch to create the flat surface needed after lamination.

Laser-ablating openings is cost-efficient for small CSP and 01005 component pads. Components of about 0201 size and above can utilize a different strategy in conjunction with 'print-filling' vias with a via-fill material that 'sinters' to an Sn/Cu alloy during lamination. For these larger component pads the patch according to the present embodiments can have laser cut-thru openings (quicker and cheaper than ablation), under which is printed the Sn/Cu paste that is sintered during lamination to form component pads for normal SMT solder-attach. The various embodiments of the present invention enable the creation of small layer to layer vias. Because the patches in accordance with the present invention can be accurately placed with SMT equipment, small pads (for vias) on different layers as well as solder bumps can be accurately paired.

The ultra-fine, delicate tracks are laminated down into the prepreg layer of the underlying structure including the PCB substrate, where they are fully secured, eliminating low peel strength of fine conductive tracks. The non-conductive substrate 12 becomes a "solder resist" layer for component assembly. This eliminates an entire set of processes that would otherwise be required to add a resist layer since the conductive tracks come with resist included.

Because of its small size, the patch can be machine placed with great accuracy for registration to the PCB substrate, eliminating alignment and stretch problems across the assembly panel. Use of a small patch also minimizes any thermal mismatch or material delamination issues within the laminated substrate.

The present invention is particularly well suited for printed via connections in a PCB substrate, because these are 'sintered' under temperature and pressure in the lamination process as well.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method comprising:

providing a layer of non-conductive material having a conductive electroplating seed layer formed on a surface thereof;

applying a photoresist layer over a top surface of the conductive electroplating seed layer;

removing portions of the photoresist layer by masking, exposing and etching the photoresist layer so as to form wiring channels in the photoresist layer;

electroplating a conductive material in the wiring channels;

attaching a layer of one of polyester or polyimide over the photoresist layer and the electroplated conductive material using a layer of adhesive; and removing the layer of non-conductive material and the conductive electroplating seed layer by peeling off the layer of non-conductive material and the conductive electroplating seed layer; and after the removing the layer of non-conductive material and the conductive electroplating seed layer, cutting the layer of one of polyester or polyimide, the layer of adhesive, the photoresist layer and the electroplated conductive material into a plurality of patches.

2. The method of claim 1 wherein said providing the layer of non-conductive material comprises providing a layer of polyester material having the conductive electroplating seed layer formed on the top surface thereof.

3. The method of claim 1 wherein the electroplating the conductive material comprises electroplating a single layer of the conductive material in the wiring channels.

4. The method of claim 1 wherein the electroplating the conductive material comprises electroplating a layer of copper in the defined wiring channels.

5. The method of claim 1 wherein attaching a layer of one of polyester or polyimide over the photoresist layer and the electroplated conductive material comprises attaching a layer of one of polyester or polyimide over the photoresist layer and the electroplated conductive material using a transfer adhesive.

6. The method of claim 1, wherein the applying a photoresist layer, the removing portions of the photoresist layer, the electroplating and the attaching a layer of one of polyester or polyimide form assembled layers that overlie the layer of non-conductive material and the conductive electroplating seed layer, and wherein the peeling off the layer of non-conductive material and the conductive electroplating seed layer separate the layer of non-conductive material and the conductive electroplating seed layer from the assembled layers.

7. The method of claim 1 wherein the layer of non-conductive material having the conductive electroplating seed layer formed on the surface thereof comprises a polyester sheet having a graphite conductive electroplating seed layer deposited on the surface thereof.

8. The method of claim 1 wherein the layer of non-conductive material comprises a roll of the non-conductive material and the conductive electroplating seed layer, the method further comprising:

cutting the roll of the non-conductive material and the conductive electroplating seed layer into panels.

9. The method of claim 8 wherein the attaching a layer of one of polyester or polyimide comprises attaching a layer of one of polyester or polyimide over the photoresist layer and the electroplated conductive material using a transfer adhesive.

10. The method of claim 1, wherein the attaching a layer of one of polyester or polyimide comprises adhering a layer of polyester or polyimide with an adhesive backing to the top surface of the photoresist layer and the top surface of the electroplated conductive material.

11. The method of claim 1 wherein the electroplating the conductive material in the defined wiring channels comprises:

electroplating a first layer of a first conductive material in the wiring channels; and electroplating a second layer of a second conductive material over the first layer of the first conductive material in the wiring channels.

12. The method of claim 11 wherein the electroplating the first layer comprises electroplating a layer of gold in the wiring channels.

13. The method of claim 11 wherein the electroplating the second layer comprises electroplating a layer of nickel over the first layer in the wiring channels.

14. The method of claim 11, wherein the electroplating the first layer of the first conductive material in the wiring channels comprises electroplating a layer of a gold in the wiring channels; and wherein the electroplating the second layer of the second conductive material in the wiring channels comprises electroplating a layer of nickel over the layer of gold in the wiring channels.

15. A method comprising:

providing a layer of non-conductive material having a conductive electroplating seed layer formed on a surface thereof;

applying a photoresist layer over a top surface of the conductive electroplating seed layer;

removing portions of the photoresist layer by masking, exposing and etching the photoresist layer so as to form wiring channels in the photoresist layer;

electroplating a first layer of a first conductive material in the wiring channels;

electroplating a second layer of a second conductive material over the first layer in the wiring channels;

attaching a layer of one of polyester or polyimide over the photoresist layer and the electroplated second conductive material using a layer of adhesive;

removing the layer of non-conductive material and the conductive electroplating seed layer by peeling off the layer of non-conductive material and the conductive electroplating seed layer; and after the removing the layer of non-conductive material and the conductive electroplating seed layer, cutting the layer of one of polyester or polyimide, the layer of adhesive, the photoresist layer and the electroplated first and second conductive material into a plurality of patches.

16. The method of claim 15 wherein attaching the layer of one of polyester or polyimide, comprises attaching the layer of one of polyester or polyimide over the photoresist layer and the electroplated second conductive material using a transfer adhesive.

17. The method of claim 15 wherein the attaching a layer of one of polyester or polyimide comprises adhering a layer of polyester or polyimide with an adhesive backing to the top surface of the photoresist layer and the top surface of the electroplated second conductive material.

18. The method of claim 15 wherein the first conductive material comprises gold.

19. The method of claim 15 wherein the second conductive material comprises nickel.

* * * * *